US008504894B1

(12) United States Patent
Zeng et al.

(10) Patent No.: US 8,504,894 B1
(45) Date of Patent: Aug. 6, 2013

(54) SYSTEMATIC ENCODING FOR NON-FULL ROW RANK, QUASI-CYCLIC LDPC PARITY CHECK MATRICES

(75) Inventors: Lingqi Zeng, San Jose, CA (US); Yu Kou, San Jose, CA (US); Kin Man Ng, Cupertino, CA (US); Kwok W. Yeung, Milpitas, CA (US)

(73) Assignee: SK hynix memory solutions inc., San Jose, CA (US)

( * ) Notice: Subject to any disclaimer, the term of this patent is extended or adjusted under 35 U.S.C. 154(b) by 231 days.

(21) Appl. No.: 13/039,040

(22) Filed: Mar. 2, 2011

Related U.S. Application Data

(60) Provisional application No. 61/339,564, filed on Mar. 4, 2010, provisional application No. 61/330,627, filed on May 3, 2010.

(51) Int. Cl.
*H03M 13/00* (2006.01)
(52) U.S. Cl.
USPC .......................................... 714/758; 714/774
(58) Field of Classification Search
USPC .................................. 714/758, 774
See application file for complete search history.

(56) References Cited

U.S. PATENT DOCUMENTS

| | | | |
|---|---|---|---|
| 5,905,666 A | 5/1999 | Hoffman et al. | |
| 6,757,122 B1 | 6/2004 | Kuznetsov et al. | |
| 7,962,828 B2 | 6/2011 | Kyung et al. | |
| 8,095,859 B1 | 1/2012 | Peterson et al. | |
| 8,196,010 B1 | 6/2012 | Gunnam et al. | |
| 8,255,764 B1 | 8/2012 | Yeo et al. | |
| 8,255,765 B1 | 8/2012 | Yeo et al. | |
| 8,347,190 B2 | 1/2013 | Brauchle et al. | |
| 8,359,515 B2 | 1/2013 | Gunnam | |
| 2002/0188906 A1 | 12/2002 | Kurtas et al. | |
| 2008/0052594 A1 | 2/2008 | Yedidia et al. | |
| 2008/0126908 A1* | 5/2008 | Lin ............................... | 714/758 |
| 2008/0163027 A1 | 7/2008 | Richardson et al. | |
| 2008/0276156 A1 | 11/2008 | Gunnam et al. | |
| 2008/0301521 A1 | 12/2008 | Gunnam et al. | |
| 2009/0138785 A1 | 5/2009 | Sakai et al. | |
| 2009/0150746 A1 | 6/2009 | Chaichanavong et al. | |
| 2009/0327847 A1 | 12/2009 | Shen et al. | |
| 2010/0023838 A1* | 1/2010 | Shen et al. ..................... | 714/758 |
| 2010/0153819 A1 | 6/2010 | Ueng et al. | |
| 2010/0162074 A1* | 6/2010 | Oh et al. ........................ | 714/752 |
| 2010/0169736 A1* | 7/2010 | Garani .......................... | 714/752 |
| 2010/0257425 A1 | 10/2010 | Yue et al. | |
| 2012/0221913 A1 | 8/2012 | Anholt et al. | |

OTHER PUBLICATIONS

Li et al., "Efficient Encoding of Quasi-Cyclic Low-Density Parity-Check Codes," IEEE Transactions on Communications, vol. 54, No. 1, Jan. 2006.

* cited by examiner

*Primary Examiner* — M. Mujtaba K Chaudry
(74) *Attorney, Agent, or Firm* — Van Pelt, Yi & James LLP

(57) ABSTRACT

Encoding is performed by putting a low-density parity-check (LDPC) generator matrix into partial quasi-cyclic form comprising an identity matrix, a parity generator matrix, a zero matrix and a remainder matrix. The parity generator matrix is quasi-cyclic and the remainder matrix is not quasi-cyclic. An encoder is used to generate LDPC encoded data using the parity generator matrix and without using the remainder matrix.

17 Claims, 10 Drawing Sheets

$H_{QC\text{-}LDPC}$, Full Rank

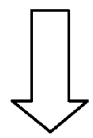

$$G_{QC\text{-}LDPC} = \begin{bmatrix} \overbrace{\begin{matrix} I & 0 & \cdots & 0 & 0 \\ 0 & I & \cdots & 0 & 0 \\ \vdots & & \ddots & & \vdots \\ 0 & 0 & \cdots & I & 0 \\ 0 & 0 & \cdots & 0 & I \end{matrix}}^{I\ (302)} & \overbrace{\begin{matrix} G_{0,0} & \cdots & G_{0,c-1} \\ G_{1,0} & \cdots & G_{1,c-1} \\ \vdots & \ddots & \vdots \\ G_{t-c-2,0} & \cdots & G_{t-c-2,c-1} \\ G_{t-c-1,0} & \cdots & G_{t-c-1,c-1} \end{matrix}}^{P\ (304)} \end{bmatrix} \Big\} n-m = (t-c)b$$

$\underbrace{\qquad\qquad\qquad\qquad}_{n = tb}$

— 306

Encoded Data (c) = User Data (u) * (Generator Matrix )

$c = [u_0 \cdots u_{n-m-1}] * [I\ P]$

1xn Matrix = 1x(n-m) Matrix * (n-m)xn Matrix $c = [u_0 \cdots u_{n-m-1}\ p_0 \cdots p_{m-1}]$

SYSTEMATIC ENCODING FOR NON-FULL ROW RANK, QUASI-CYCLIC LDPC PARITY CHECK MATRICES

CROSS REFERENCE TO OTHER APPLICATIONS

This application claims priority to U.S. Provisional Patent Application No. 61/339,564 entitled QUASI-CYCLIC LOW-DENSITY-PARTY-CHECK CODES ENCODING filed Mar. 4, 2010 which is incorporated herein by reference for all purposes and U.S. Provisional Patent Application No. 61/330,627 entitled LDPC ENCODER AND DECODER filed May 3, 2010 which is incorporated herein by reference for all purposes.

BACKGROUND OF THE INVENTION

Quasi-cyclic low-density parity-check (QC-LDPC) codes are a subset of LDPC codes. QC-LDPC codes are attractive compared to non-QC-LDPC codes because matrices associated with QC-LDPC codes can be stored using much less memory compared to non-QC-LDPC codes. H is an m×n parity check matrix and for QC-LDPC codes (but not non-QC-LDPC codes) H comprises of a (m/b)×(n/b) array of b×b circulants. If the QC-LDPC parity check matrix H is a full row rank matrix (i.e., all m rows are independent) then the corresponding generator matrix G can similarly be expressed in quasi-cyclic form comprising of circulants. Having both the parity check matrix (H) and generator matrix (G) be in quasi-cyclic form is attractive because it is only necessary to store one row or column vector from a circulant; from this single row or column vector of the circulant the entire matrix can be reconstructed. In contrast, it may be necessary to store the entire matrix for non-QC-LDPC codes.

There may be cases in which non-full row rank codes are desired or required. It would be desirable if techniques could be developed for using non-full row rank codes which consume less storage compared to current techniques. It would also be useful if such storage-efficient techniques could be used in a system which stores multiple (e.g. user-programmable) codes and loads a selected code (e.g., comprising a corresponding pair of generator and parity check matrices) into a configurable or programmable encoder.

BRIEF DESCRIPTION OF THE DRAWINGS

Various embodiments of the invention are disclosed in the following detailed description and the accompanying drawings.

FIG. 3 is a diagram showing an embodiment of a QC-LDPC generator matrix.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
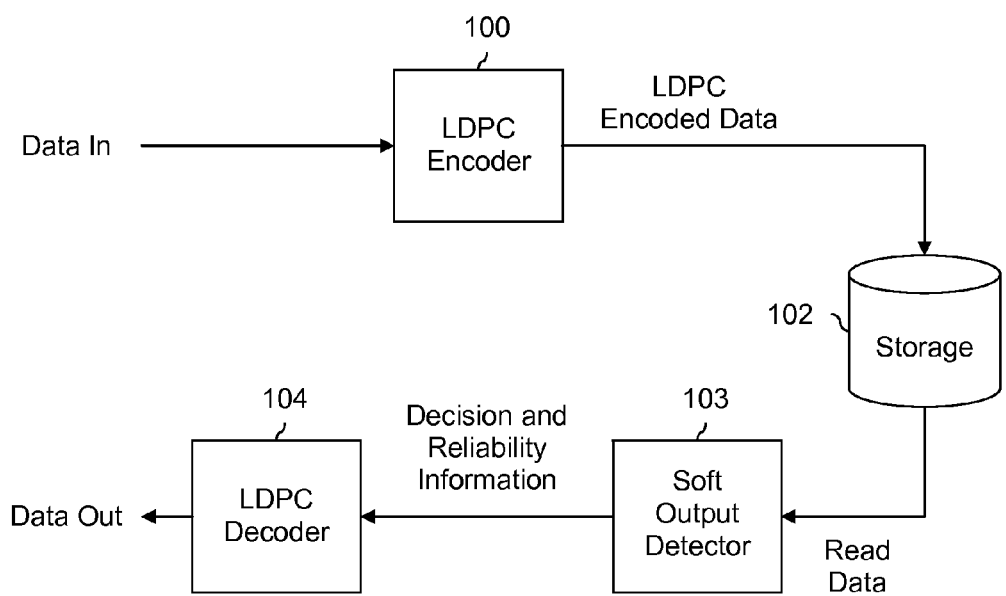
FIG. 1 is a diagram showing an embodiment of a system configured to encode and store data using a low-density parity-check (LDPC) code.

FIG. 1 is a diagram showing an embodiment of a system configured to encode and store data using a low-density parity-check (LDPC) code. In the example shown, LDPC encoder 100 receives data in and includes data which is desired to be stored. LDPC encoded data is output by LDPC encoder 100 and is written to storage 102.

In various embodiments, storage 102 includes a variety of storage types or media such as (e.g., magnetic) disk drive storage, Flash storage, etc. In some embodiments, the techniques are employed in a transceiver and instead of being written to or read from storage, the data is transmitted and received over a channel (e.g., wire-line or wireless).

When the stored data is requested or otherwise desired (e.g., by an application or user which stored the data), soft output detector 103 accesses storage 102 and retrieves read data which includes some noise or errors. Soft output detector 103 performs decoding on the read data and outputs decision and reliability information. For example, soft output detector 103 may be a soft output Viterbi decoder. A hard decoder (which decoder 103 is not) is one that outputs a decision without providing corresponding reliability information. For example, a hard decoder may output a decision that a particular bit is a "1" or a "0" without indicating how certain or sure the decoder is in that decision. In contrast, a soft output detector outputs a decision and reliability information associated with the decision. A reliability value (in general) indicates how certain the decoder is in a given decision. In one example, a soft output decoder outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and reliability information is passed to LDPC decoder 104 which performs LDPC decoding using the decision and reliability information. The data generated by LDPC decoder 104 is passed to the appropriate entity (e.g., the user or application which requested it). With proper encoding and decoding, the data in matches the data out.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

In LDPC codes (both quasi-cyclic (QC) and non-QC), the code is defined by or otherwise characterized by a parity check matrix (H); for all LDPC codes, H is a matrix of size $m \times n$ (i.e., m rows and n columns). One property of QC-LDPC codes is that they have a structure which is relatively repeatable or repetitive, which makes them attractive because a smaller amount of storage can be used to store the matrix. In particular, a QC-LDPC parity check matrix ($H_{QC-LDPC}$) has a building block called a circulant from which a QC-LDPC parity check matrix can be (re)generated. An example of a QC-LDPC parity check matrix and circulant are described in further detail below.

From the null space of a $m \times n$ QC-LDPC parity check matrix H, a $k \times n$ QC-LDPC generator matrix ($G_{QC-LDPC}$) can be generated, where k>=n-m and "=" occurs only when H is full row rank. A generator matrix (for both QC and non-QC codes) is used to generate LDPC encoded data from the input data. For example, if the input data is represented as u, a $1 \times (n-m)$ matrix, and the encoded write data is represented as c (a $1 \times n$ matrix) then c=u*G, where "*" is a matrix multiplication. In some cases, a generator matrix (G) is manipulated to be in a special form (i.e., a systematic matrix) where G=[I P] and I is the identity matrix and P is a parity generator matrix. In systematic form, the encoded data (c) includes the input data (u) in its original form. In one example, the encoded data may be the input data (u) followed by the parity bits. Parity data (p) may be obtained from u*P and when combined (e.g., by appending or concatenating) with the input data generates the codeword (i.e., the encoded data).

Figure 2:
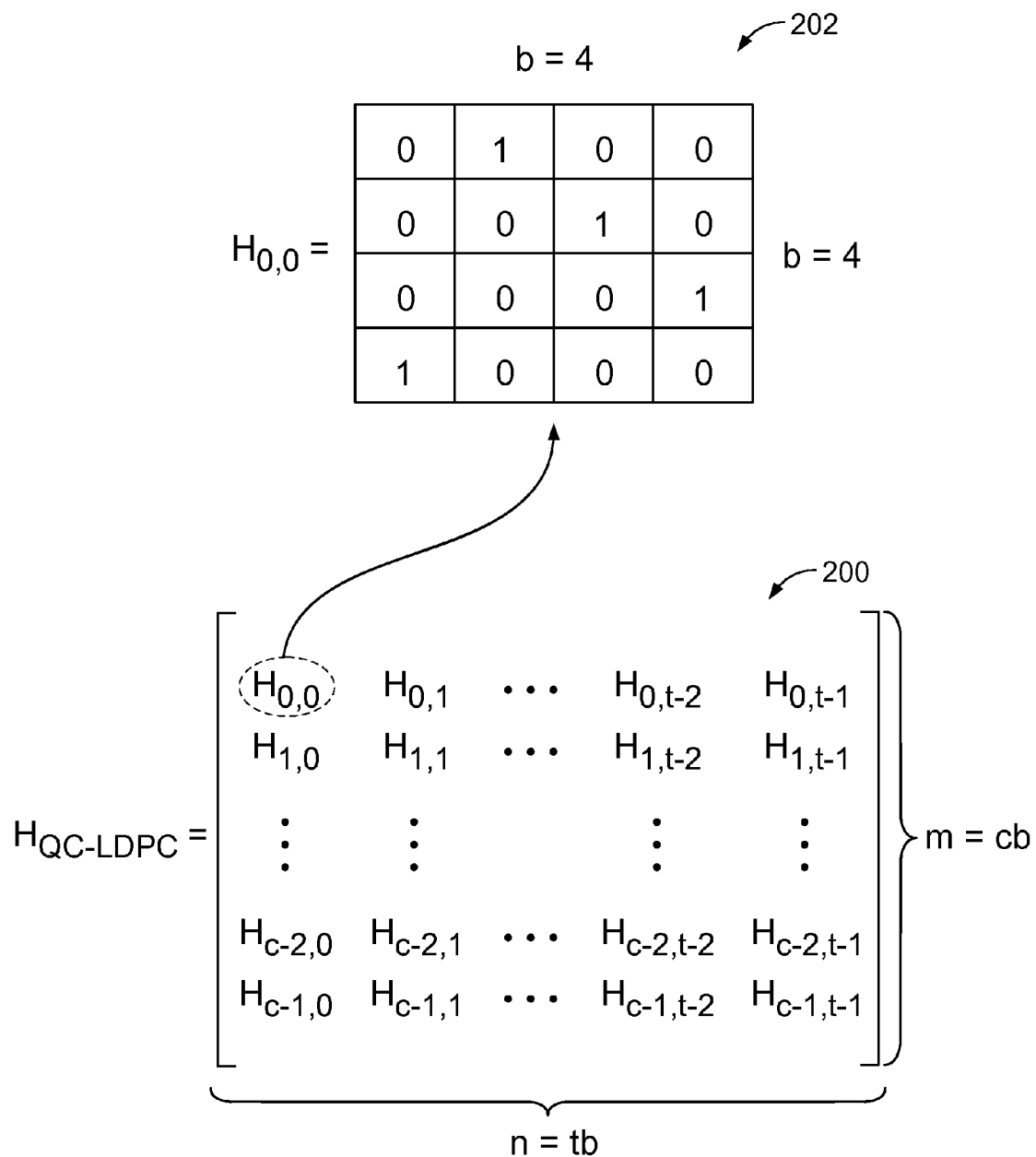
FIG. 2 is a diagram illustrating an embodiment of a QC-LDPC parity check matrix and a circulant from which the associated QC-LDPC parity check can be (re)generated.

FIG. 2 is a diagram illustrating an embodiment of a QC-LDPC parity check matrix and a circulant from which the associated QC-LDPC parity check can be (re)generated. In the example shown, QC-LDPC parity check matrix ($H_{QC-LDPC}$) is an $m \times n$ matrix where both m and n are the product of two integers (i.e., c and b in the case of m and t and b in t). QC-LDPC parity check matrix 200 includes a plurality of circulants, $A_{i,j}$. A circulant is a square matrix having dimensions $b \times b$ where each row vector or column vector is a cyclic shift (e.g., up or to the left) of the row vector or column vector before it. The dimension b is the circulant size. Circulant 202 shows an example circulant for $A_{0,0}$. In this example, b =4 and each row vector in circulant 202 is a copy of the previous row vector which is cyclically shifted one place to the right where values at the end wrap around to the beginning Information associated with one or more circulants is stored and using the stored information the QC-LDPC parity check matrix 200 can be completely regenerated. Some examples of what circulant-related information is stored is described in further detail below.

From a QC-LDPC parity check matrix which is full row rank, a quasi-cyclic generator matrix ($G_{QC-LDPC}$) can be generated. The following figure shows one example.

FIG. 3 is a diagram showing an embodiment of a QC-LDPC generator matrix. In the example shown, generator matrix 300 is able to be expressed in quasi-cycle form because the corresponding parity check matrix is a full row rank matrix. QC-LDPC generator matrix 300 is shown in systematic form where G=[I P] and as shown in this example includes identity matrix 302 which is a (n-m)×(n-m) matrix and parity matrix 304 which is a (n-m)×m matrix. Parity matrix 304 is quasi-cyclic and therefore includes circulants $G_{i,j}$ and (as described above) the entire generator matrix can be reconstructed without having to save the entire matrix. The form shown herein is a systematic form where the generator matrix includes the identity matrix (I) which results in the encoded data (c) including the input data (u) in its original form. In one example, the encoded data may be the input data (u) followed by the parity bits. Parity data (p) may be obtained from u * P and when combined (e.g., by appending or concatenating) with the input data generates the codeword (i.e., the encoded data).

Diagram 306 shows the number of matrix multiplications associated with generating LDPC encoded data using QC-LDPC generator matrix 300. In the example shown, the input data is u, a 1×(n-m) matrix, and the generator matrix G is a (n-m)×n matrix. This produces encoded data (c) which comprises of $[u_0 \ u_1 \ \ldots \ u_{n-m-2} \ u_{n-m-1} \ p_0 \ p_1 \ \ldots \ p_{m-2} \ p_{m-1}]$ where $u_i$ are user bits and $p_j$ are parity bits.

The following figure shows an exemplary form of a generator matrix when the corresponding parity check matrix is not a full row rank matrix.

Figure 4A:
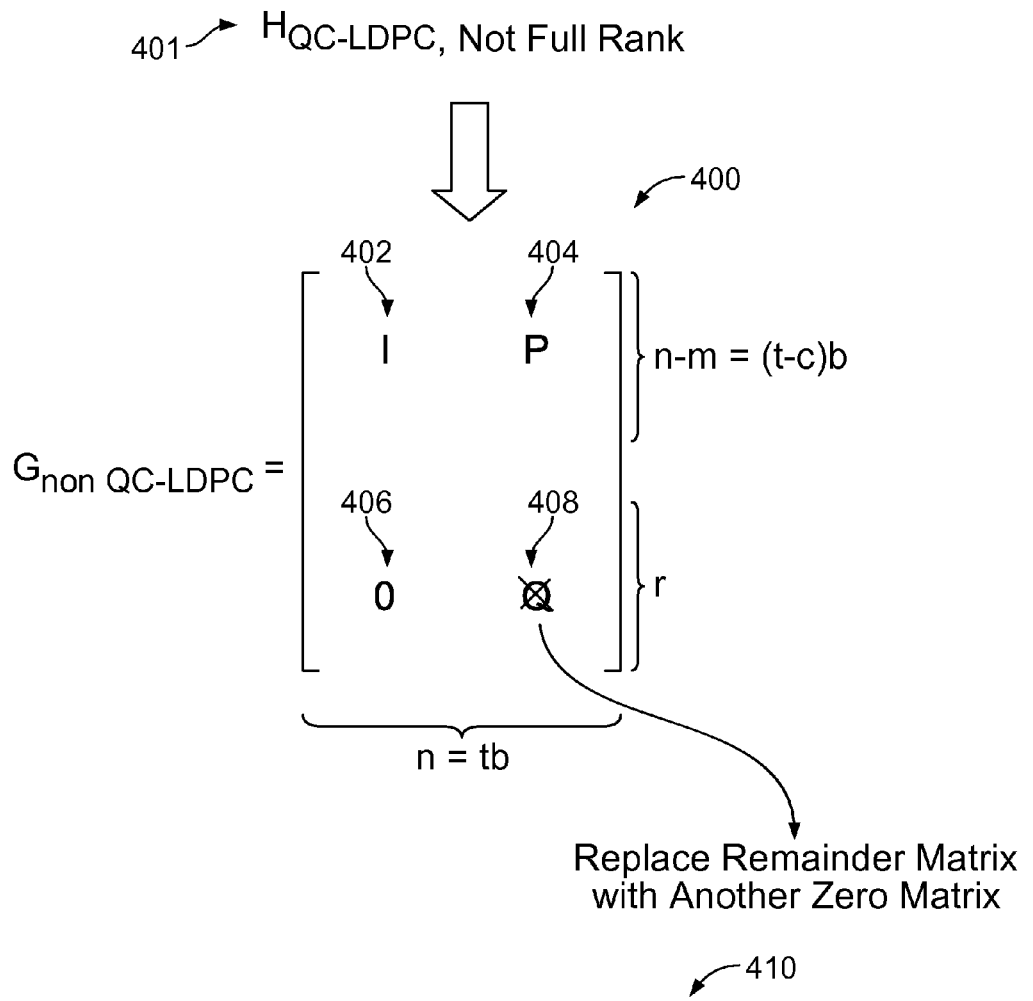
FIG. 4A is a diagram showing a first embodiment for generating LDPC encoded data using a parity generator matrix and without using remainder matrix.

FIG. 4A is a diagram showing a first embodiment for generating LDPC encoded data using a parity generator matrix and without using remainder matrix. In the example shown, because parity check matrix 401 is not a full row rank matrix, generator matrix 400 can only be put into a partial quasi-cyclic form where generator matrix 400 comprises [I P; 0 Q] and P (404) is quasi-cyclic but Q (408) is not. The identity matrix 402 is a (n-m)×(n-m) matrix, parity generator matrix 404 is a (n-m)×m matrix, zero matrix 406 is a $r \times (n-m)$ matrix and remainder matrix 408 is a $r \times m$ matrix. The parameter r therefore corresponds to the height or number of rows in remainder matrix 408 (that is, the number of dependent rows in H).

What is described herein is an encoding technique in which remainder matrix 408 is zeroed out or otherwise discarded; encoded data is generated by using identity matrix 402 and parity generator matrix 404 and but not remainder matrix 408 (or more specifically, the non-zero terms in the remainder matrix).

In the embodiment shown in 410, encoded data is generated by matrix multiplying padded user data with the generator matrix without the generator matrix. That is, $[u_0 \ldots u_{n-m-1} \ pad_0 \ldots pad_{r-1}] * [I \ P; 0 \ 0]$. In various embodiments, the r pad bits may be any values since they will be zeroed out during matrix multiplication. The third equation in 410 shows both the matrix operations performed when the remainder matrix is discarded as well as when the remainder matrix is used.

Specially, the matrix multiplication of a 1×r matrix and a r×n matrix (shown in strikethrough) is performed when remainder matrix 408 is used and is not performed when remainder matrix 408 is not included or otherwise used in generating the encoded data. In 410, remainder matrix 408 is replaced with a zero matrix so all of the products will be zero and it is not necessary to perform the operation shown in strikethrough since a zero product will not affect the result. This produces a codeword comprising of n-m user bits and m+r parity bits.

Figure 4B:
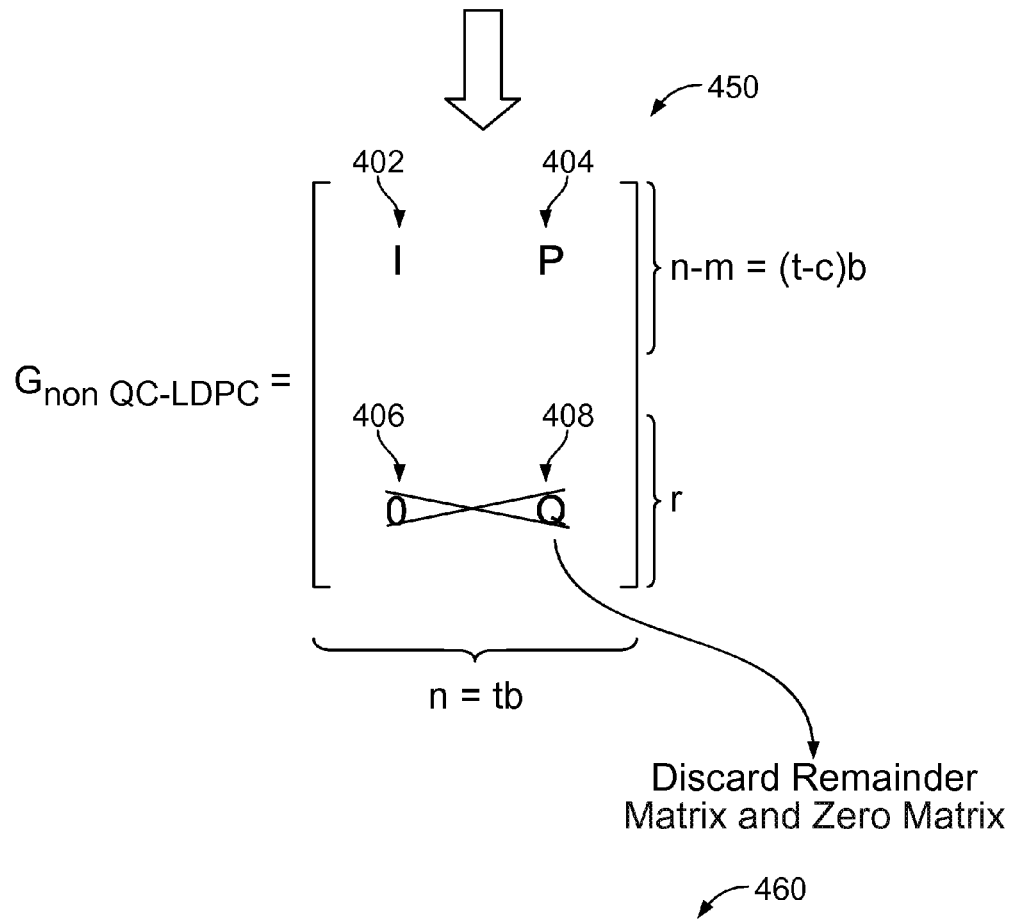
FIG. 4B is a diagram showing a second embodiment for generating LDPC encoded data using a parity generator matrix and without using remainder matrix.

FIG. 4B is a diagram showing a second embodiment for generating LDPC encoded data using a parity generator matrix and without using remainder matrix. In this example, encoding is performed using the matrix multiplication $[u_0 \ldots u_{n-m-1}]*[I\ P]$, as shown in 460. In this embodiment, the last r row vectors of generator matrix 400 (corresponding to zero matrix 406 and remainder matrix 408) have been discarded (see 450) and the user data vector includes no pad bits (as compared to 410 in FIG. 4A). The generated codewords in this figure and that shown in FIG. 4A will be the same (assuming the same I, P and (n-m) bits of user data).

To decode the encoded data, the corresponding parity check matrix (e.g., 401 in FIG. 4A) is used and known decoding techniques and components (e.g., soft output detectors, LDPC decoders which perform message passing, etc.) may be used.

The encoded technique described herein has a number of benefits. First, extra circuitry is not required to perform the matrix multiplications which would be required if the remainder matrix were included in generating the encoded data (e.g., corresponding to the operation shown in strikethrough in 410 in FIG. 4A). Another benefit is that by discarding or otherwise zeroing out the remainder matrix, the storage requirements to store the generator matrix are reduced. The parity generator matrix 404 is quasi-cyclic and the elements in identity matrix 402 are known, so it may be sufficient to store enough information to reconstruct parity generator matrix 404 and some dimensions (e.g., the height and/or width of identity matrix 402 and/or the height and/or width of remainder matrix 408) and not store the values or elements within the remainder matrix. Another attractive feature is that the technique produces encoded data is systematic form where the user data is replicated or otherwise included in the encoded data. Systematic codes are desirable in some applications since on the decoder side no additional step is required to obtain the user data (put another way, non-systematic encoded data after decoding would require an additional step to recover the user data).

Figure 5:
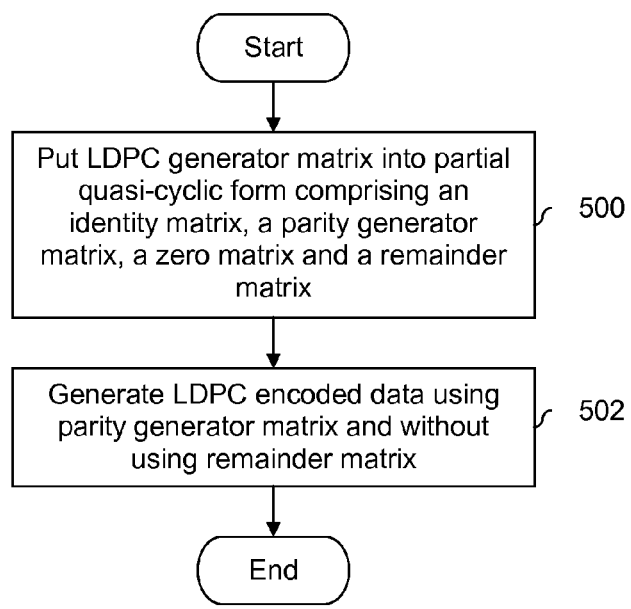
FIG. 5 is a flowchart illustrating an embodiment of a process for performing LDPC encoding in a storage-efficient manner when a parity check matrix is not full row rank.

FIG. 5 is a flowchart illustrating an embodiment of a process for performing LDPC encoding in a storage-efficient manner when a parity check matrix is not full row rank. In the example shown, a LDPC generator matrix is put into partial quasi-cyclic form comprising an identity matrix, a parity generator matrix, a zero matrix and a remainder matrix at 500. The generator matrix in 500 has a corresponding parity check matrix which is not full row rank and so it is not possible for the generator matrix in 500 to be expressed in full quasi-cyclic form (e.g., [I P] where I is the identity matrix and P is quasi-cyclic).

At 502, LDPC encoded data is generated using the parity generator matrix and without using the remainder matrix. For example, the remainder matrix may be replaced by a second zero matrix and the matrix multiplication $[u_0 \ldots u_{n-m-1}\ pad_0 \ldots pad_{r-1}]*[I\ P;\ 0\ 0]$ is performed. In another embodiment, the zero matrix and the remainder matrix are removed and the matrix multiplication $[u_0 \ldots u_{n-m-1}]*[I\ P]$ is performed.

In some embodiments, a system is programmable or configurable and is able to operate using a specified or selected LDPC code. For example, the code may be loaded from an external source and/or the system may include storage for storing codes and when instructed (e.g., by some driver, application or other entity) one of the stored codes is selected and loaded. The following shows an embodiment where such a configurable encoder is able (using the techniques described herein) to load and use LDPC codes where the parity check matrices are both full row rank and non-full row rank. This may be desirable since it does not limit the set of usable codes to those with full row rank parity check matrices.

Figure 6:
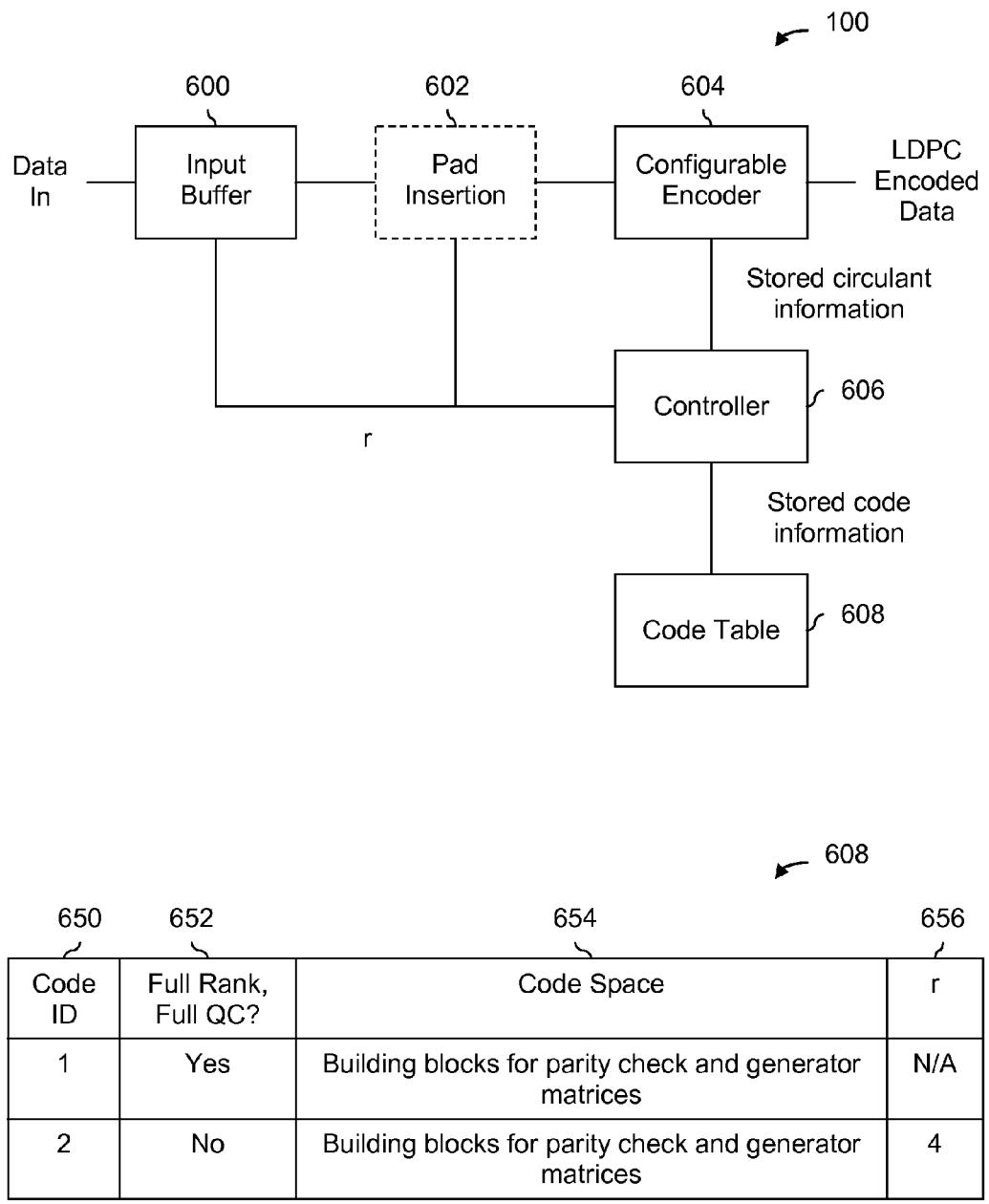
FIG. 6 is a diagram showing an embodiment of a code table and a programmable encoder configured to store and use codes in a storage efficient manner, including those codes with non-full row rank parity check matrices.

FIG. 6 is a diagram showing an embodiment of a code table and a programmable encoder configured to store and use codes in a storage efficient manner, including those codes with non-full row rank parity check matrices. In some embodiments, LDPC encoder 100 from FIG. 1 is implemented as shown.

Before any data is encoded, controller 606 configures other components in the system. The programming sequence described herein is merely exemplary and is not necessarily limiting. Controller 606 receives some indication to load a specified code, for example from some driver, application or other entity. In response to the indication, controller 606 accesses code table 608 and accesses the stored code information for the specified code. Using this information, controller 606 programs configurable encoder 604 so that the specified code is loaded. In some embodiments, configurable encoder 604 is a "dumb" device and controller 606 determines appropriate values for all elements in the parity check matrix and generator matrix (e.g., from some smaller building block(s) stored in code table 608) and provides or otherwise programs configurable encoder 604 with all of those values, e.g., fully populating some matrix space within configurable encoder 604. In some other embodiments, configurable encoder 604 includes some intelligence and once provided the building block(s) from controller 606 is able to determine the entire matrix (e.g., configurable encoder 604 knows there is some repeatable pattern in the generator matrix and/or parity check matrix and populates at least some of the values in its internal matrix space with appropriate values).

Controller 606 also programs input buffer 600 to input a proper amount of user data to be encoded. Zero pad 602 is optional but if included is similarly programmed. In this example, the height (r) of a remainder matrix (when applicable) is passed to input buffer 600 and zero pad 602 from controller. For example, if the matrix multiplication $[u_0 \ldots u_{n-m-1}\ pad_0 \ldots pad_{r-1}]*[I\ P;\ 0\ 0]$ or $[u_0 \ldots u_{n-m-1}]*[I\ P]$ is performed, input buffer will need to know how much user data to obtain. Similarly, in the first example above, pad insertion 602 will need to know how many bits of pad to insert (when applicable) and so it also needs to know the value of r. In some embodiments, when a code is selected which has a generator matrix which is able to be expressed in full quasi-cyclic form is selected (e.g., because its corresponding parity check matrix is full row rank), r is set to 0.

In this example, the components know beforehand the values of n and m; in some other embodiments the values of n and/or m are configurable and controller 606 programs appropriate components with the values of n and/or m if needed.

Once controller 606 has completed programming appropriate components, encoding begins. Data in is passed to an input buffer 600 which determines the appropriate amount of user data to encode at each pass or iteration and passes the properly sized group to pad insertion 602. A pad size corresponding to the high or number or row vectors in a remainder matrix (if applicable) is inserted and the padded data is passed to configurable encoder 604. Using the generator matrix loaded into it (e.g., a generator matrix which has the remainder matrix removed and the zero matrix removed or one which has the remainder matrix removed and a second zero matrix inserted in place of the remainder matrix), configurable encoder 604 encodes the padded data passed to it and output LDPC encoded data. The LDPC encoded data may be further processed and subsequently stored in storage media or transmitted over a communications channel. In some other embodiments, there is no pad and the generator matrix loaded into configurable encoder 604 has its zero matrix and remainder matrix removed.

The bottom portion of FIG. 6 shows an embodiment of a code table. In the example shown, each code is assigned a unique code ID (see column 650) and in some embodiments, a driver or application provides controller 606 with the unique code ID of a desired code when specifying or selecting a code. Column 652 in code table 608 indicates whether a parity check matrix associated with the code is a full row rank, fully quasi-cyclic. For example, the code with an ID of 1 may correspond to the example code shown in FIG. 3 (e.g., one where the generator matrix is able to be put into full quasi-cyclic form because its corresponding parity check matrix is full row rank) whereas the code with an ID of 2 may correspond to the example shown in FIG. 4A or 4B (e.g., one where the generator matrix is not able to be put into full quasi-cyclic form).

Code space 654 is used to store information used to reconstruct or regenerate a parity check matrix and/or generator matrix associated with a particular code. In some embodiments, a row vector or column vector from one or more circulants associated with a matrix are stored in code space 654. Column 656 is used to store dimension information associated with a code. In this example, the value of r (i.e., the height or number of row vectors in a remainder matrix, if any) is stored in column 656. In some other embodiments, additional and/or alternative dimensions are stored (e.g., m, n, or k).

Figure 7:
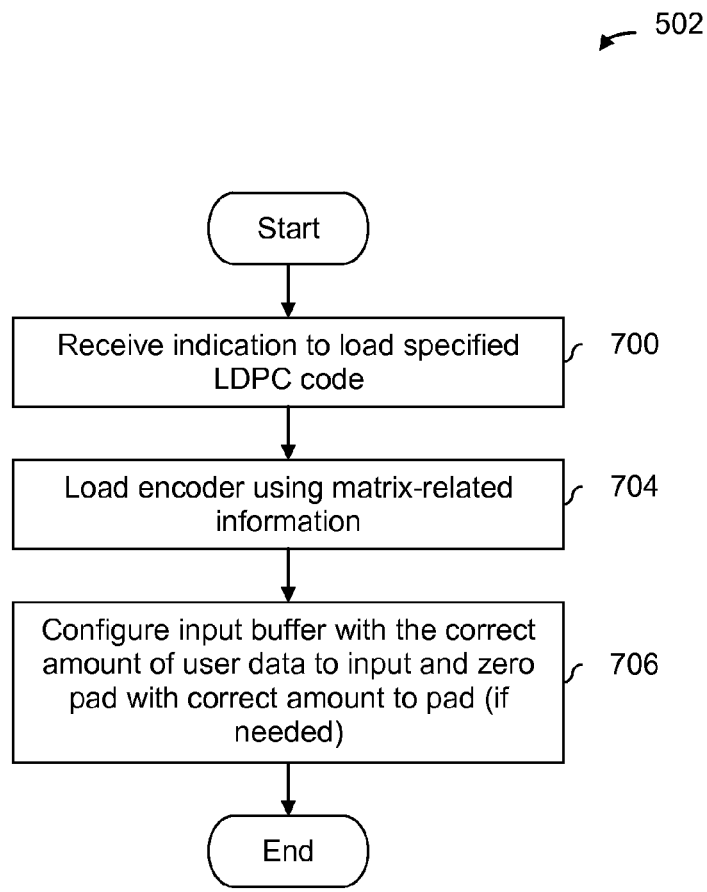
FIG. 7 is a diagram showing an embodiment for generating LDPC encoded data using a parity generator matrix and without using a remainder matrix.

FIG. 7 is a diagram showing an embodiment for generating LDPC encoded data using a parity generator matrix and without using a remainder matrix. In the example shown, a programmable or otherwise configurable system is shown, for example which stores a plurality of codes and loads a selected one to be used in encoding and/or decoding. In some embodiments, step 502 in FIG. 5 is implemented as shown.

At 700, an indication to load a specified LDPC code is received. For example, a unique code ID of a stored code may be specified, or a code may be loaded via some interface or I/O port. At 704, an encoder is loaded using matrix-related information. For example, using stored building blocks retrieved from memory or using some information provided by an external device via some interface or I/O port, some matrix space within a programmable encoder and/or decoder is loaded with a generator matrix and/or parity check matrix. At 706, an input buffer is configured with the correct amount of user data to input and a zero pad is configured with a correct amount to pad (if needed). For example, some codes may be perfectly quasi-cyclic and require no padding and/or a full amount of user data may be encoded at each iteration. Other codes are only partially quasi-cyclic and various codes may have different degrees to which they are able to be put into quasi-cyclic form (i.e., the parameter r may vary from partially quasi-cyclic code to partially quasi-cyclic code).

Storing the generator matrix and/or the parity check matrix

Some systems are configured to store the generator matrix and/or the parity check matrix. For example, a system may store a plurality of matrix pairs, each of which is associated with a different data rate, different error correction capabilities, etc. A user or driver may configure the system to load a specified matrix pair and encode/decode information using the loaded matrix pair. Such a system may be more attractive than a system with a single, hardcoded matrix pair since it offers flexibility and/or multiple modes of operation. In another example, a system is initially "blank" and a user or driver loads a matrix pair into the system where it is stored. For example, some end users may prefer to use a specific LDPC code and/or not have other people (including a storage or communication systems manufacture) know what code is being used. The following figures are used to describe some techniques for storing a generator matrix and/or a parity check matrix in an efficient manner.

Figure 8:
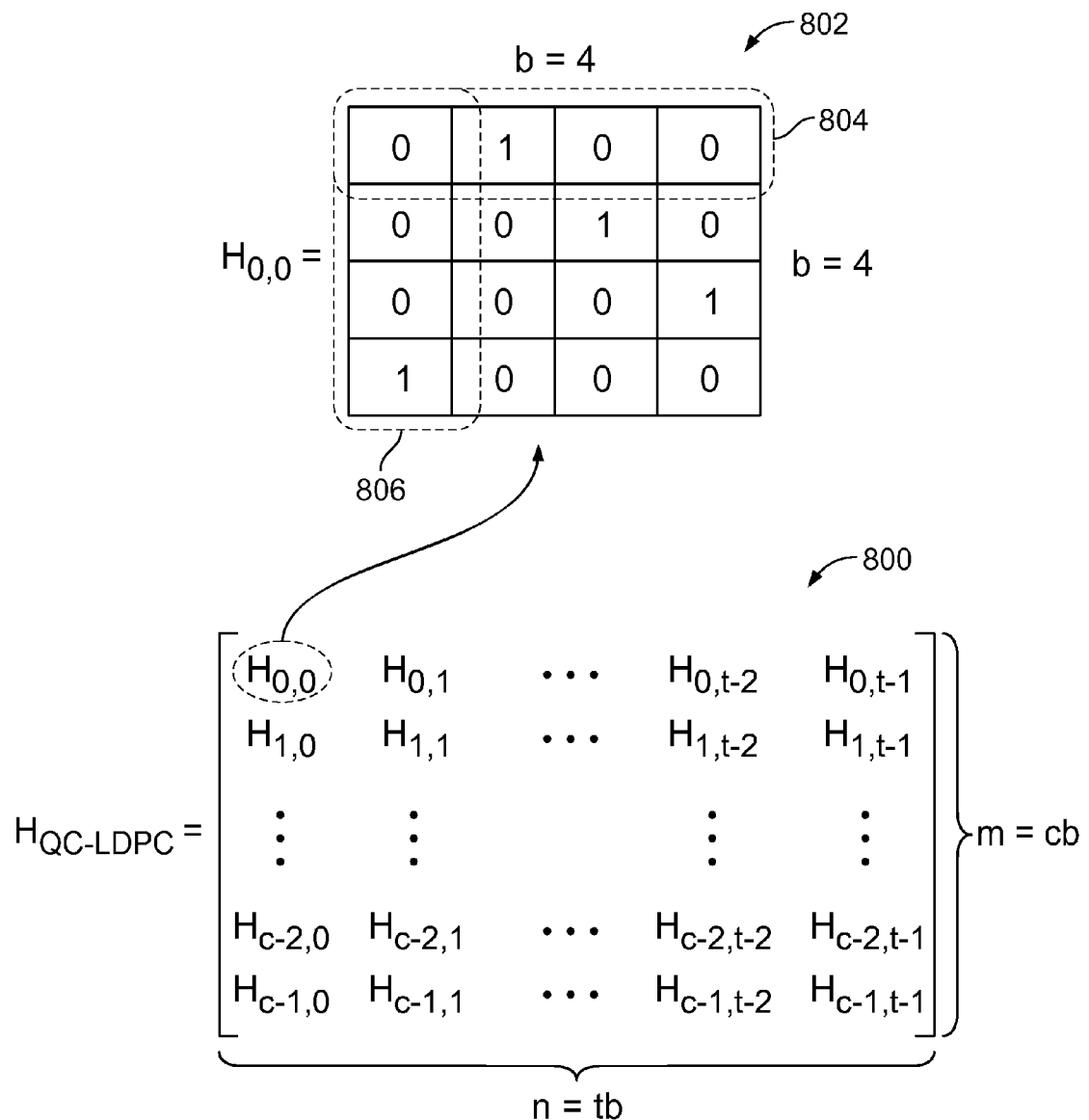
FIG. 8 is a diagram showing an embodiment of a QC-LDPC parity check matrix.

FIG. 8 is a diagram showing an embodiment of a QC-LDPC parity check matrix. In the example shown, QC-LDPC parity check matrix 800 includes a plurality of circulants. One of the circulants, $H_{0,0}$ (802), is shown and has a circulant size of b=4 in this example. Circulant 802 includes a plurality of vectors, including row vector 804 and column vector 806.

Figure 9:
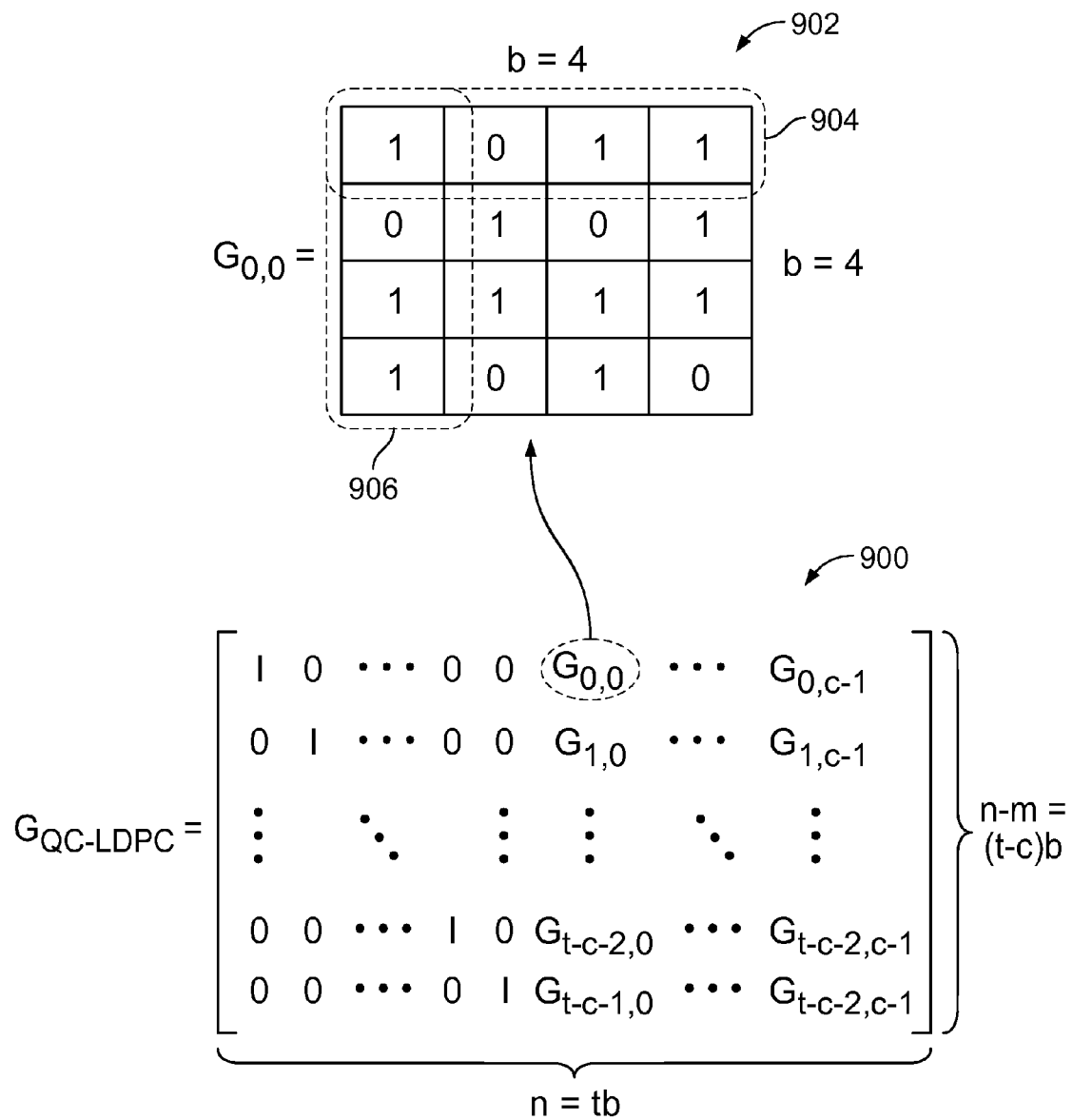
FIG. 9 is a diagram showing an embodiment of a QC-LDPC generator matrix.

FIG. 9 is a diagram showing an embodiment of a QC-LDPC generator matrix. In the example shown, QC-LDPC generator matrix 900 includes a plurality of circulants; circulant $G_{0,0}$ (902) is shown with an example circulant size of b=4. A plurality of vectors make up circulant 902, including row vector 904 and column vector 906.

Oftentimes LDPC parity check matrices (which include QC-LDPC parity check matrices) are low density matrices. Put another way, the number of 1's in a LPDC parity check matrix tends to be low. In contrast, an LDPC generator matrix typically is not low density and has a more 1's compared to the parity check matrix.

In some embodiments, for a given one of the circulants (e.g., associated with a parity check matrix or a generator matrix), one and only one vector from that circulant is stored. For example, for parity check matrix 802, the only information stored for that circulant is row vector 804. Or, for generator matrix 902, the only information stored for that circulant is column vector 906. In some embodiments, a single vector is stored for each circulant (e.g., a first vector from circulant $G_{0,0}$ is stored, a second vector from $G_{0,1}$ is stored, etc.).

In some embodiments, storing the parity check matrix includes storing, for at least one of the plurality of circulants, the location(s) of the 1's in one vector. For example, for circulant 804 associated with QC-LDPC parity check matrix 800, column vector 806 is stored (from which circulant 804 can be reconstructed). In some embodiments, storing the location is more storage efficient for low density matrices. As a result, in some embodiments, the technique of storing a location is used for storing information associated with parity check matrices but not necessarily for generator matrices which tend to have higher densities. In some embodiments, if the number of 1's in a circulant (e.g., one of circulants $H_{i,j}$ is less than $b/(ceil(log_2(b)))$, where b is the circulant size, then the location of 1's is stored. In some embodiments, this threshold is based on the assumption that the locations are stored in base 2 format.

In some embodiments, when there is relatively small number of 1's (e.g., in a row vector of the circulant), a non-base 2 format is used to store the location of the 1's. In one example, if the circulant size (i.e., b) is 12 then the valid locations of 1's would be (in decimal) 1 (i.e., there is a 1 in the first element of the vector), 2 (i.e., there is a 1 in the second element of the vector), ..., 11 and 12. In binary (i.e., base 2), this would be 0001, 0010, ..., 1011, and 1100. An example of a non-base 2 format is [6 3 2 1] which results in all 16 combinations of 0000 thru 1111 being mapped to 0 thru 12 (in decimal) when this [6 3 2 1] format is used. In some cases this is a many to one mapping (e.g., both 0100 and 0011 in this format will map to 3 in decimal). One benefit to using a non-base 2 format to store locations is a more efficient hardware design (e.g., when implemented as a field-programmable gate array (FPGA) or application-specific integrated circuit (ASIC)). For example, addressing the memory is made easier and there is less routing congestion. Another advantage is that a non-base 2 format can be used to avoid some or all out-of-bounds addresses. In the [6 3 2 1] example above, it is impossible to map to 13-15 in decimal and thus those out-of-bounds addresses (for this example where the circulant size b=12) cannot be accidentally accessed. In some embodiments, 0000 (e.g., in base 2 format or some non-base 2 format such as [6 3 2 1]) represents a special value: an all zero matrix or vector.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for encoding, comprising:
a controller which:
receives an indication associated with loading a low-density parity-check (LDPC) code;
accesses, from storage, a building block associated with the LDPC code based at least in part on the received indication; and
provides the building block at least once to an encoder;
a pad inserter which, in the event the LDPC code is associated with a non-full row rank parity check matrix, inserts a pad into input data; and
the encoder which generates, in the event the LDPC code is associated with a non-full row rank parity check matrix, LDPC encoded data using (1) a parity generator matrix, which includes the building block and an all zeros vector which spans the entire width of the parity generator matrix, and (2) the input data with the pad inserted.

2. The system recited in claim 1, wherein the LDPC encoded data is stored on storage and the storage includes one or more of the following: magnetic disk storage or Flash storage.

3. The system recited in claim 1, wherein the controller further:
accesses, from the storage, a height; and
provides the height to the pad inserter, wherein the length of the pad inserted by the pad inserter is based at least in part on the height.

4. The system recited in claim 1, wherein:
the parity generator matrix includes a plurality of circulants ($G_{i,j}$); and
the building block includes one and only one vector from at least one of the plurality of circulants.

5. The system recited in claim 1, wherein:
the parity generator matrix has a corresponding parity check matrix (H) which includes a plurality of circulants ($H_{i,j}$);
the building block includes one and only one vector from at least one of the plurality of circulants.

6. The system recited in claim 1, wherein:
the parity generator matrix has a corresponding parity check matrix (H) which includes a plurality of circulants ($H_{i,j}$); and
the building block includes the location(s) of the 1's in one and only one vector from at least one of the plurality of circulants.

7. The system recited in claim 6, wherein the building block includes the location(s) of the 1's in the event the number of 1's in the parity check matrix is less than b/(ceil($\log_2(b)$)) where b is the circulant size.

8. The system recited in claim 6, wherein the location(s) of the 1's includes the location(s) in non base 2.

9. A method for encoding, comprising:
receiving an indication associated with loading a low-density parity-check (LDPC) code;
accessing, from storage, a building block associated with the LDPC code based at least in part on the received indication;
providing the building block at least once to an encoder;
in the event the LDPC code is associated with a non-full row rank parity check matrix, inserting a pad into input data; and
using an encoder to generate, in the event the LDPC code is associated with a non-full row rank parity check matrix, LDPC encoded data using (1) a parity generator matrix, which includes the building block and an all zeros vector which spans the entire width of the parity generator matrix, and (2) the input data with the pad inserted.

10. The method recited in claim 9, wherein the LDPC encoded data is stored on storage and the storage includes one or more of the following:
magnetic disk storage or Flash storage.

11. The method recited in claim 9, further comprising:
accessing, from the storage, a height; and
providing the height to the pad inserter, wherein the length of the pad inserted is based at least in part on the height.

12. The method recited in claim 9, wherein:
the parity generator matrix includes a plurality of circulants ($G_{i,j}$); and
the building block includes one and only one vector from at least one of the plurality of circulants.

13. The method recited in claim 9, wherein:
the parity generator matrix has a corresponding parity check matrix (H) which includes a plurality of circulants ($H_{i,j}$);
the building block includes one and only one vector from at least one of the plurality of circulants.

14. The method recited in claim 9, wherein:
the parity generator matrix has a corresponding the parity check matrix (H) which includes a plurality of circulants ($H_{i,j}$); and
the building block includes the location(s) of the 1's in one and only one vector from at least one of the plurality of circulants.

15. The method recited in claim 14, wherein the building block includes the location(s) of the 1's in the event the number of 1's in the parity check matrix is less than b/(ceil($\log_2(b)$)) where b is the circulant size.

16. The method recited in claim 14, wherein the location(s) of the 1's includes the location(s) in non base 2.

17. A computer program product for encoding, the computer program product being embodied in a non-transitory computer readable storage medium and comprising computer instructions for:
receiving an indication associated with loading a low-density parity-check (LDPC) code;

accessing, from storage, a building block associated with the LDPC code based at least in part on the received indication;

providing the building block at least once to an encoder;

in the event the LDPC code is associated with a non-full row rank parity check matrix, inserting a pad into input data; and using an encoder to generate, in the event the LDPC code is associated with a non-full row rank parity check matrix, LDPC encoded data using (1) a parity generator matrix, which includes the building block and an all zeros vector which spans the entire width of the parity generator matrix, and (2) the input data with the pad inserted.

* * * * *